United States Patent [19]

Hanke, III et al.

[11] Patent Number: 5,376,848
[45] Date of Patent: Dec. 27, 1994

[54] DELAY MATCHING CIRCUIT

[75] Inventors: C. Christopher Hanke, III; William F. Johnstone, both of Austin, Tex.; Michael W. Hodel, Mesa, Ariz.; Tzu-Hui P. Hu, Tempe, Ariz.; Barry Heim, Mesa, Ariz.

[73] Assignee: Motorola, Inc., Schaumburg, Ill.

[21] Appl. No.: 43,112

[22] Filed: Apr. 5, 1993

[51] Int. Cl.⁵ .................... H03K 3/366; H03K 5/135
[52] U.S. Cl. .................. 327/141; 331/1 A; 327/156; 327/281; 326/95
[58] Field of Search ............ 307/279, 291, 448, 452, 307/453, 481, 571, 593, 594, 605, 606, 608; 331/1 A; 377/77, 79

[56] References Cited

U.S. PATENT DOCUMENTS

| | | | |
|---|---|---|---|
| 4,689,581 | 8/1987 | Talbot | 331/1 A |
| 4,839,541 | 6/1989 | Gal et al. | 307/481 |
| 4,843,254 | 6/1989 | Motegi et al. | 307/279 |
| 4,933,571 | 6/1990 | Pribyl | 307/452 |
| 5,212,410 | 5/1993 | Sase | 307/279 |

Primary Examiner—R. Skudy
Assistant Examiner—Shawn Riley
Attorney, Agent, or Firm—Lee E. Chastain

[57] ABSTRACT

A delay matching circuit has a first node (48), a second node (50), a first loading circuit (54, 56), a second loading circuit (58, 60), a third loading circuit (64) and a buffer circuit (62). The first loading circuit couples a first logic state to the first node responsive to a first state of a control signal. The second loading circuit couples a second logic state to the first node responsive to a second state of the control signal. The buffer circuit electrically couples the first and second nodes. The first loading circuit, second loading circuit and buffer circuit are characterized by a first, a second and a third predetermined electrical impedance, respectively. The third loading circuit is coupled to the second node and is characterized by a fourth predetermined electrical impedance. The disclosed delay matching circuit propagates a clock signal input with a delay equal to the Clock-to-Q delay associated with a flip-flop constructed with similar circuit elements. The disclosed delay matching circuit is useful in circuits, such as phase locked loops, where the simultaneous propagation of two signals is critical.

20 Claims, 3 Drawing Sheets

DELAY MATCHING CIRCUIT

FIELD OF THE INVENTION

The present invention generally relates to digital circuits, and more specifically to a delay circuit for use with a flip-flop.

BACKGROUND OF THE INVENTION

Flip-flops are one of the fundamental circuit blocks used by digital circuit designers. The term flip-flop refers, genetically, to a device that receives either a logic high or logic low state as an input and saves the input for use at some later time. Typically, a flip-flop samples and saves its input at a time indicated by a clocking signal. Otherwise, the ignores the logic state at its input. Flip-flops are generally the simplest example of a binary memory circuit.

Flip-flops are often used in applications where signal propagation delays are critical. For instance, a phase locked loop (hereafter simply "PLL") is a device that synchronizes an output clock signal to a master or "input clock signal in both phase and frequency. The output clock signal is fed back to an input of the PLL where the phase and frequency of the output clock signal are continuously compared to the phase and frequency of the master clock signal. Therefore, a PLL generates an output clock signal slaved to a master clock signal. A PLL may be modified to generate an output clock signal whose frequency is a particular ratio of the frequency of the input clock signal. Such a circuit is useful in data processors that use an internal clock signal that has a higher frequency than the frequency of an input bus clock signal. A designer may control the ratio of the bus and internal clock frequencies by inserting a circuit reduces the frequency of the signal in the PLL feedback loop by a certain factor, typically, two, four, six, eight, etc. The PLL synchronizes the input clock signal and the "reduced frequency" clock output. Therefore, the input to the frequency reducing circuit is two, four, six, eight times, etc., greater than the frequency of the input clock signal. The input to the frequency reducing circuit is then used as the "output" of the PLL.

Flip-flops are often used to build the frequency reducing circuit described above. Unfortunately, a frequency reducing circuit incorporating a flip-flop introduces delay into the feedback loop of the PLL, This delay causes the two clock signals to become misaligned with respect to phase if the input of the frequency reducing circuit generates the output of the PLL. In some applications this delay may be unacceptable, Also, this delay may be so small that it may not be possible to model the delay prior to circuit manufacture with enough accuracy to design a delay matching circuit.

SUMMARY OF THE INVENTION

In accordance with the present invention, there is disclosed a delay matching circuit that has a controllable signal delay which substantially eliminates disadvantages of prior circuits that use buffers alone to match the delay of a flip-flop.

A delay matching circuit has a first node, a second node, a first loading circuit, a second loading circuit, a third loading circuit and a buffer circuit. The first loading circuit couples a first logic state to the first node responsive to a first state of a control signal. The second loading circuit couples a second logic state to the first node responsive to a second state of the control signal. The buffer circuit electrically couples the first and second nodes. A first, a second and a third predetermined electrical impedance characterize the first loading circuit, second loading circuit and buffer circuit, respectively. The third loading circuit is coupled to the second node. A fourth predetermined electrical impedance characterizes the third loading circuit.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
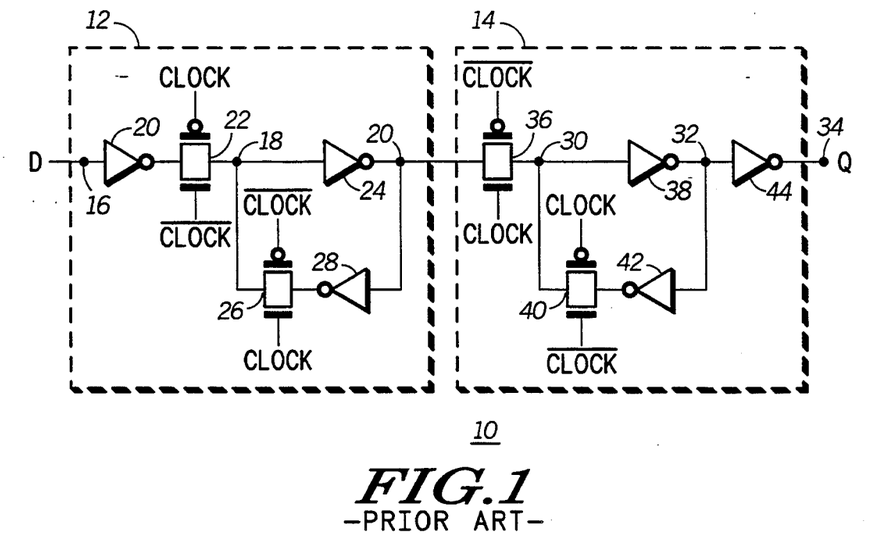
FIG. 1 depicts a logic diagram of a master-slave flip-flop known in the art.

FIG. 1 depicts a logic diagram of a master-slave flip-flop (hereafter flip-flop) known in the art. Flip-flop 10 has a master portion 12 and a slave portion 14. Slave portion 14 introduces a delay into a circuit incorporating flip-flop 10 known as a "Clock-to-Q propagation delay." The Clock-to-Q propagation delay is the amount of time a signal takes to propagate through slave portion 14 from the activation of the clocking signal. In certain applications, the Clock-to-Q propagation delay must be matched in a parallel circuit path so that a second signal propagates through the parallel circuit in the same amount of time as does a signal through flip-flop 10. As described below, a delay matching circuit is provided that introduces a time delay into a circuit path that is equal to the Clock-to-Q propagation delay. Therefore, the disclosed invention discloses a buffer or a divide-by-1 path that matches the Clock-to-Q propagation delay of a flip-flop.

Master portion 12 has a master input node 16, a master intermediate node 18 and a master output node 20. Master input node 16 receives a logic state as a data input, typically labeled "D." Master input node 16 is connected to an input of an inverter 20. An output of inverter 20 is connected to a first terminal of a switch or a pass gate 22. A second terminal of pass gate 22 is connected to master intermediate node 18. A first control terminal and a second control terminal of pass gate 22 are connected to a control signal CLOCK and to its logical complement, $\overline{\text{CLOCK}}$, respectively. As depicted, the signals CLOCK and $\overline{\text{CLOCK}}$ cause pass gate 22 to conduct when the signal CLOCK corresponds to a low logic state. Master intermediate node 18 is connected to an input of an inverter 24 and to a first terminal of a pass gate 26. An output of inverter 24 is connected to master output node 20. A second terminal of pass gate 26 is connected to an output of an inverter 28. An input of inverter 28 is connected to master output node 20. A first control terminal and a second control terminal of pass gate 26 are connected to control signal $\overline{\text{CLOCK}}$ and to its logical complement, CLOCK, respectively. As depicted, the signals CLOCK and $\overline{\text{CLOCK}}$ cause pass gate 26 to conduct when the signal CLOCK corresponds to a high logic state.

Slave portion 14 has a slave input node 30, a slave intermediate node 32 and a slave output node 34. Slave output node 34 generates a logic state as a data output, typically labeled "Q." Slave input node 30 is connected to a first terminal of a pass gate 36. A second terminal of pass gate 36 is connected to master output node 20. A first control terminal and a second control terminal of pass gate 36 are connected to control signal $\overline{\text{CLOCK}}$ and to its logical complement, CLOCK, respectively. As depicted, the signals CLOCK and $\overline{\text{CLOCK}}$ cause pass gate 36 to conduct when the signal CLOCK corresponds to a high logic state. Slave input node 30 is connected to an input of an inverter 38 and to a first terminal of a pass gate 40. An output of inverter 38 is connected to slave intermediate node 32. A second terminal of pass gate 40 is connected to an output of an inverter 42. An input of inverter 42 is connected to slave intermediate node 32. A first control terminal and a second control terminal of pass gate 40 are connected to the control signal CLOCK and to its logical complement, $\overline{\text{CLOCK}}$, respectively. As depicted, the signals CLOCK and $\overline{\text{CLOCK}}$ cause pass gate 40 to conduct when the signal CLOCK corresponds to a low logic state. Slave intermediate node 32 is also connected to an input of an inverter 44. An output of inverter 44 is connected to slave output node 34.

In operation, flip-flop 10 has two phases of operation. Each phase is characterized by one of the two possible logic states of the control signal CLOCK.

In the first phase, CLOCK corresponds to a low logic state. Pass gates 22 and 40 are therefore in a conducting state. The data input D is forwarded to master output node 20. However, the data input is not forwarded to slave portion 14 because pass gate 36 is not in a conducting state. Instead, inverters 38 and 42 form a latch and retain the data input D from an immediately preceding phase. This older data is output to slave output node 34.

In the second phase, CLOCK corresponds to a high logic state. Pass gates 26 and 36 are therefore in a conducting state. Inverters 24 and 28 form a latch and retain the data input D from the immediately preceding first phase. The data input D is simultaneously forwarded to slave output node 34 through pass gate 36. As described above, flip-flop 10 will output this same data input during the following cycle. Flip-flop 10 is known as a positive edge-triggered flip-flop because slave portion 14 passes its input data to its output beginning with a low-to-high transition of the control signal CLOCK. Flip-flop 10 may be modified to create a negative edge-triggered flip-flop by reversing the connections of the control signals CLOCK and $\overline{\text{CLOCK}}$ to pass gates 22, 26, 38 and 40.

Figure 2:
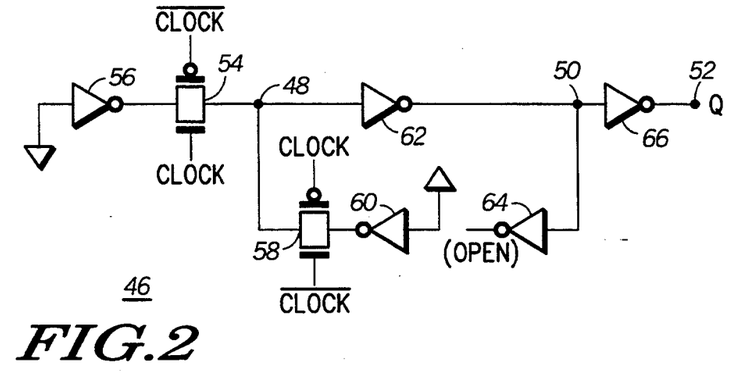
FIG. 2 depicts a logic diagram of a delay matching circuit constructed in accordance with the present invention for use with the master-slave flip-flop depicted in FIG. 1.

FIG. 2 depicts a logic diagram of a delay matching circuit 46 constructed in accordance with the present invention for use with the master-slave flip-flop 10 depicted in FIG. 1. Delay matching circuit 46 has a matching input node 48, a matching intermediate node 50 and a matching output node 52. A logic state is provided at matching output node 52 as a data output, labeled "Q." As will be described below, matching output node 52 may merge with matching intermediate node 50 in some embodiments of the disclosed invention. Delay matching circuit 46 simulates the electrical characteristics of slave input node 30 and slave intermediate node 32 (depicted in FIG. 1) at matching input node 48 and matching intermediate node 50, respectively. Therefore, delay matching circuit 46 propagates a logic signal through itself in a time equal to the Clock-to-Q propagation delay of flip-flop 10 (depicted in FIG. 1).

Continuing with FIG. 2, a first terminal of a pass gate 54 is connected to matching input node 48. A second terminal of pass gate 54 is connected to an output of an inverter 56. An input of inverter 56 is connected to a first voltage supply level. A first terminal of a pass gate 58 is also connected to matching input node 48. A second terminal of pass gate 58 is connected to the output of an inverter 60. An input of inverter 60 is connected to a second voltage supply level. An input of an inverter 62 is connected to matching input node 48. An output of inverter 62 is connected to matching intermediate node 50. Matching intermediate node 50 is also connected to an input of an inverter 64 and to an input of an inverter 66. An output of inverter 64 is not connected to any other node. Inverter 64 may be connected to a first terminal of an additional pass gate for additional delay matching precision. The additional pass gate may be clocked by the control signals CLOCK and $\overline{\text{CLOCK}}$. An output of inverter 66 is connected to matching output node 52. As depicted, each of the control signals CLOCK and $\overline{\text{CLOCK}}$ is connected to pass gates 54 and 58 in such a manner as to place pass gate 54 in a conducting state when CLOCK corresponds to a high logic state and to place pass gate 58 in a conducting state when the signal $\overline{\text{CLOCK}}$ corresponds to a high logic state.

In operation, delay matching circuit 46 receives the control signals CLOCK and $\overline{\text{CLOCK}}$, generates an output logically equivalent to one of the two control signals, and delays the output a time equal to the Clock-to-Q propagation delay of flip-flop 10. The particular logic state output relative to the two control signals depends upon the polarity of the voltage supplies connected to inverters 56 and 60. For example, in the depicted embodiment, if the control signal CLOCK corresponds to a high logic state, then delay matching circuit 46 will output the logical inverse of the logic state corresponding to the first voltage supply level. Conversely, if the control signal $\overline{\text{CLOCK}}$ corresponds to a high logic state, then delay matching circuit 46 will output the logical inverse of the logic state corresponding to the second voltage supply level. Hereafter, and as depicted in FIG. 1, the first and second voltage supply levels shall correspond to a low and to a high logic state, respectively. Therefore, a high CLOCK signal generates a high output at matching output node 52. A low CLOCK signal generates a low output at matching output node 52. Delay matching circuit 46 acts as a buffer. If the polarity of each of the control signals was reversed with respect to pass gates 54 and 58, then delay matching circuit 46 would be an inverting buffer. In addition, delay matching circuit 46 is a positive edge-triggered device. Delay matching circuit 46 may be modified to be a negative edge-triggered device by reversing the polarity of the control signals with respect to pass gates 54 and 58.

Flip-flops are used in circuits that reduce the frequency of an input signal by a certain integer value. This type of circuit is often referred to as a "divide-by-N" circuit, where N is an integer. For instance, flip-flop 10 may be modified by directly connecting nodes 32 and 16 (not shown) to create a divide-by-2 circuit. Such a circuit generates a periodic clocking signal having half the frequency of the control signal CLOCK. Therefore, delay matching circuit 46 may be referred to as a "divide-by-1" delay matching circuit because of the correspondence between the control signals and the output signal.

Matching output node 52 generates the appropriate logic state after the same time delay as does slave output node 34 (depicted in FIG. 1). The delay through matching circuit 46 is equal to the Clock-to-Q propagation delay of flip-flop 10 because nodes 48, 50 and 52 have the same electrical impedance as do nodes 30, 32 and 34, respectively.

In particular, slave input node 30 is driven by one of two buffers, either inverter 24 or inverter 42. These two buffers are selectively connected to slave input node 30 by pass gates 36 and 40, respectively. To mirror flip-flop 10, inverters 56 and 60 drive matching input node 48 through pass gates 54 and 58, respectively. The voltage at slave intermediate node 32 is determined by the voltage at slave input node 30 inverted by inverter 38. Therefore, the voltage at matching intermediate node 50 is determined by the voltage at matching input node 48 inverted by inverter 62. In addition, the voltage at slave intermediate node 32 is connected to the input of inverter 42. Similarly, the voltage at matching intermediate node 50 is connected to the input of inverter 64. Finally, the voltage at slave output node 34 is determined by the voltage at slave intermediate node 32 inverted by inverter 44. Similarly, the voltage at matching output node 52 is determined by the voltage at matching intermediate node 50 inverted by inverter 66.

In one embodiment, each circuit element in delay matching circuit 46 is a physical copy of the corresponding element depicted in FIG. 1. For instance, the geometric data that defines slave portion 14 is replicated to create delay matching circuit 46. The input to inverter 42 is broken from slave intermediate node 32 and is instead tied to the second voltage level. As described above, another inverter is added to delay matching circuit 46 and its input is connected to matching intermediate node 50. More precise delay matching may be accomplished by locating the two circuits near one another on the same integrated circuit. In the illustrated embodiment, pass gates 54 and 58 are copies of pass gates 36 and 40, respectively. Inverters 24, 38, 42 and 44 are physical copies of inverters 56, 62, 60 and 66, respectively. In addition, the corresponding transistors within two matching inverters are identical. (Inverters 42, 60 and 64 are physically identical.)

Figure 3:
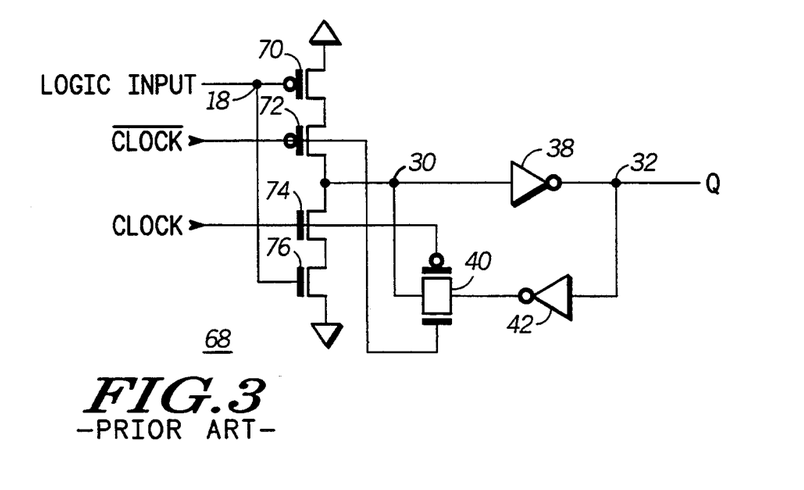
FIG. 3 depicts a partial schematic diagram of a portion of a second flip-flop known in the art.
Figure 4:
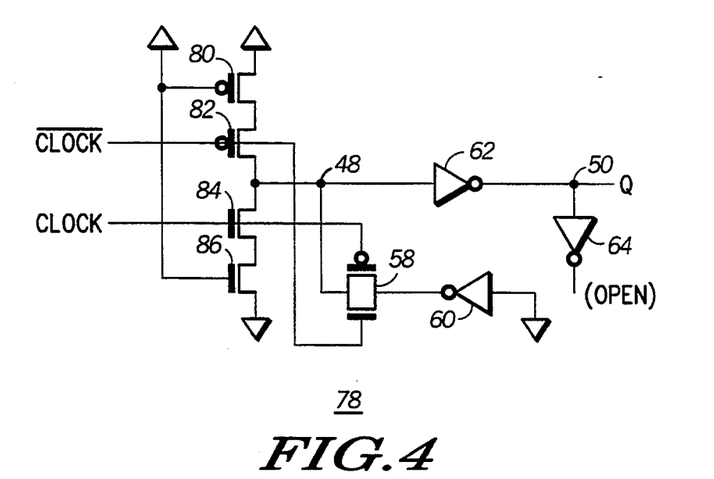
FIG. 4 depicts a partial schematic diagram of a delay matching circuit constructed in accordance with the present invention for use with the portion of a second flip-flop depicted in FIG. 3.

FIG. 3 depicts a partial schematic diagram of a portion of a second flip-flop 68 known in the art. Flip-flop 68 differs from flip-flop 10 (depicted in FIG. 1) because flip-flop 68 combines inverter 24 and pass gate 36. The remainder of master portion 12 is omitted for clarity. FIG. 4, described below, illustrates how a delay matching circuit may be constructed given typical variations of flip-flop design.

Flip-flop 68 has master intermediate node 18, slave input node 30 and slave intermediate node 32. Master intermediate node 18 is connected to a gate of a transistor 70. A source and a drain of transistor 70 are connected to the second voltage supply level and to a source of a transistor 72, respectively. A gate and a drain of transistor 72 are connected to the control signal $\overline{\text{CLOCK}}$ and to slave input node 30, respectively. Slave input node 30 is also connected to a drain of a transistor 74. A gate and a source of transistor 74 are connected to the control signal CLOCK and to a drain of a transistor 76, respectively. A gate and a source of transistor 76 are connected to master intermediate node 18 and to the first voltage supply level, respectively. The input and output of inverter 38 are connected to slave input node 30 and to slave intermediate node 32, respectively. Slave input node 30 is also connected to the first terminal of pass gate 40. The second terminal of pass gate 40 is connected to the output of inverter 42. The input of inverter 42 is connected to slave intermediate node 32. As depicted, each of the control signals CLOCK and $\overline{\text{CLOCK}}$ is connected to pass gate 40 in such a manner as to place pass gate 40 in a conducting state when CLOCK corresponds to a low logic state. As depicted, transistors 70 and 72 are P-channel devices. Transistors 74 and 76 are N-channel devices.

The operation of flip-flop 68 is substantially similar to the operation of slave portion 14 described above in connection with FIG. 1. However, transistors 70, 72, 74 and 76 perform the functions described in connection with inverter 24 and pass gate 36. In addition, the data output, Q, of flip-flop 68 will follow the logic state input on master intermediate node 18 while the control signal CLOCK corresponds to a high logic state.

FIG. 4 depicts a partial schematic diagram of a delay matching circuit 78 constructed in accordance with the present invention for use with the portion of a second flip-flop 68 depicted in FIG. 3. Delay matching circuit 78 differs from delay matching circuit 46 (depicted in FIG. 2) to reflect that flip-flop 68 combines certain circuit elements of flip-flop 10. Delay matching circuit 78 has matching input node 48 and matching intermediate node 50. Matching output node 52 is merged with matching intermediate node 50 in this embodiment to reflect that an additional polarity inversion is not necessary. As described above in connection with FIG. 2, delay matching circuit 78 simulates the electrical characteristics of slave input node 30 and slave intermediate node 32 at matching input node 48 and matching intermediate node 50, respectively. Therefore, delay matching circuit 78 propagates a logic signal through itself in a time equal to the Clock-to-Q propagation delay of flip-flop 68.

Continuing with FIG. 4, a source and a gate of a transistor 80 are connected to the second voltage level supply. A drain of transistor 80 is connected to a source of a transistor 82. A gate and a drain of transistor 82 are connected to the control signal $\overline{\text{CLOCK}}$ and to matching input node 48, respectively. Matching input node 48 is also connected to a drain of a transistor 84. A gate and a source of transistor 84 are connected to the control signal CLOCK and to a drain of a transistor 86, respectively. A gate and a source of transistor 86 are connected to the second and first voltage supply level, respectively. The first terminal of pass gate 58 is also connected to matching input node 48. The second terminal of pass gate 58 is connected to the output of inverter 60. The input of inverter 60 is connected to the first voltage supply level. The input of inverter 62 is connected to matching input node 48. The output of inverter 62 is connected to matching intermediate node 50. Matching intermediate node 50 is also connected to the input of inverter 64. The output of inverter 64 is not connected to any other node. The output of inverter 62 generates the data output, Q, of delay matching circuit 78. As depicted, the control signals CLOCK and $\overline{\text{CLOCK}}$ are connected to pass gate 58 in such a manner as to place pass gate 58 in a conducting state when the signal $\overline{\text{CLOCK}}$ corresponds to a high logic state. As depicted, transistors 70 and 72 are P-channel devices. Transistors 74 and 76 are N-channel devices.

The operation of delay matching circuit 78 is substantially similar to the operation of delay matching circuit 46 described above in connection with FIG. 2. However, transistors 80, 82, 84 and 86 perform the functions described in connection with inverter 56 and pass gate 54. Also, inverter 60 is connected to the first voltage level to reflect that signal polarity difference between matching delay circuits 46 and 78. In general, delay matching intermediate node 50 generates the appropriate logic state after the same time delay as does slave intermediate node 32 (depicted in FIG. 3). The delay through matching circuit 78 is equal to the Clock-to-Q propagation delay of flip-flop 68 because nodes 48 and 50 have the same electrical impedance as do nodes 30 and 32. The electrical impedance of the two nodes is mirrored by duplicating the individual circuit paths that drive matching input node 48 and matching intermediate node 50. In particular, slave input node 30 is driven by either inverter 42 through pass gate 40, transistor 70 through transistor 72, or transistor 76 through transistor 74. To mirror flip-flop 68, inverter 60 and transistor 86 drive matching input node 48 through pass gate 58 and transistor 84, respectively. Each of these two circuit paths drives matching input node 48 during one of the two logic states of the control signal CLOCK. Transistors 80 and 82 ensure that the electrical impedance of matching input node 48 and slave input node 30 are similar, if not identical. As described above in connection with FIG. 2, inverters 62 and 64 ensure that the electrical impedance of matching intermediate node 50 and slave intermediate node 32 are also similar, if not identical.

Figure 5:
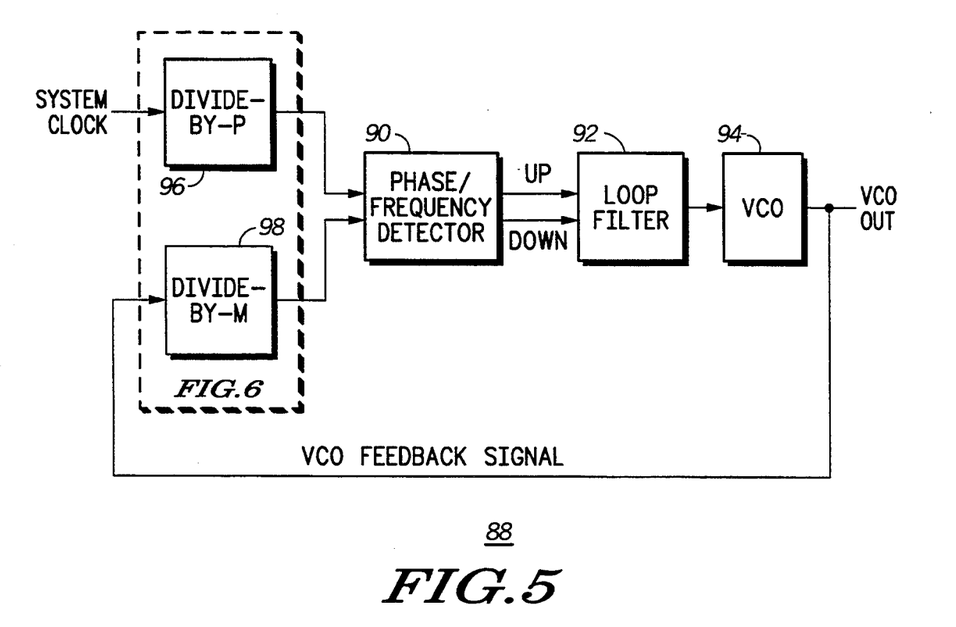
FIG. 5 depicts a block diagram of a phase locked loop for use with the present invention.

FIG. 5 depicts a block diagram of a phase locked loop (hereafter simply "PLL") 88 for use with the present invention. PLL 88 has a phase/frequency detector 90, a loop filter 92, a voltage controlled oscillator (hereafter simply "VCO") 94, a divide-by-P circuit 96 and a divide-by-M circuit 98.

The operation of phase/frequency detector 90, loop filter 92 and VCO 94 alone are known by one skilled in the art. In general, PLL 88 generates an output clock signal, VCO OUT, that is dynamically compared, via the depicted feedback loop, in phase and frequency to a reference clock signal, SYSTEM CLOCK. Phase/frequency detector 90 compares the two clock signals and provides UP and DOWN output signals. If the output clock signal is at lower frequency than the reference signal, then the UP signal will correspond to a first logic state. Conversely, if the output clock signal is at a higher frequency than the reference clock signal, then the DOWN signal will correspond to a first logic state. When the two clock signals have substantially the same phase and frequency, then both the UP and DOWN signals will correspond to a second logic state. VCO 94 increases the frequency of the signal VCO OUT when the control signal UP corresponds to a first logic state. Conversely, VCO 94 decreases the frequency of the signal VCO OUT when the control signal DOWN corresponds to a first logic state.

PLL 88 may generate an output clock signal that has a frequency different from the reference clock signal with the addition of divide-by-P circuit 86 and divide-by-M circuit 98. In particular, divide-by-P circuit 96 and divide-by-M circuit 98 reduce the frequency of a clock signal by a factor of P and M, respectively, where P and M are integers. The frequency of the output clock signal, $v_{OUT}$, is given by the relation:

$$v_{OUT} = \left(\frac{M}{P}\right)v_{IN}$$

where M and P are the integers described above and where $v_{IN}$ is the frequency of the reference clock signal, SYSTEM CLOCK.

The delay associated with the propagation of a signal through divide-by-P circuit 96 and divide-by-M circuit 98 will directly affect the phase relationship of the output clock signal, VCO OUT, with respect to the reference clock signal, SYSTEM CLOCK. PLL 88 will only align the phase of the two clock signals as those two signals arrive at phase/frequency detector 90. If the two divide-by circuits introduce two different amounts of signal propagation delay into the two clock circuit paths, then the phase relationship of the reference input clock signal with respect to the output clock signal will differ. The disclosed invention may be advantageously incorporated into PLL 88 to ensure that the two propagation delays are similar, if not identical. PLL 88 may then generate an output clock signal that is both phase locked with respect to a reference input signal and whose frequency is an integer ratio of the frequency of the reference clock signal.

Figure 6:
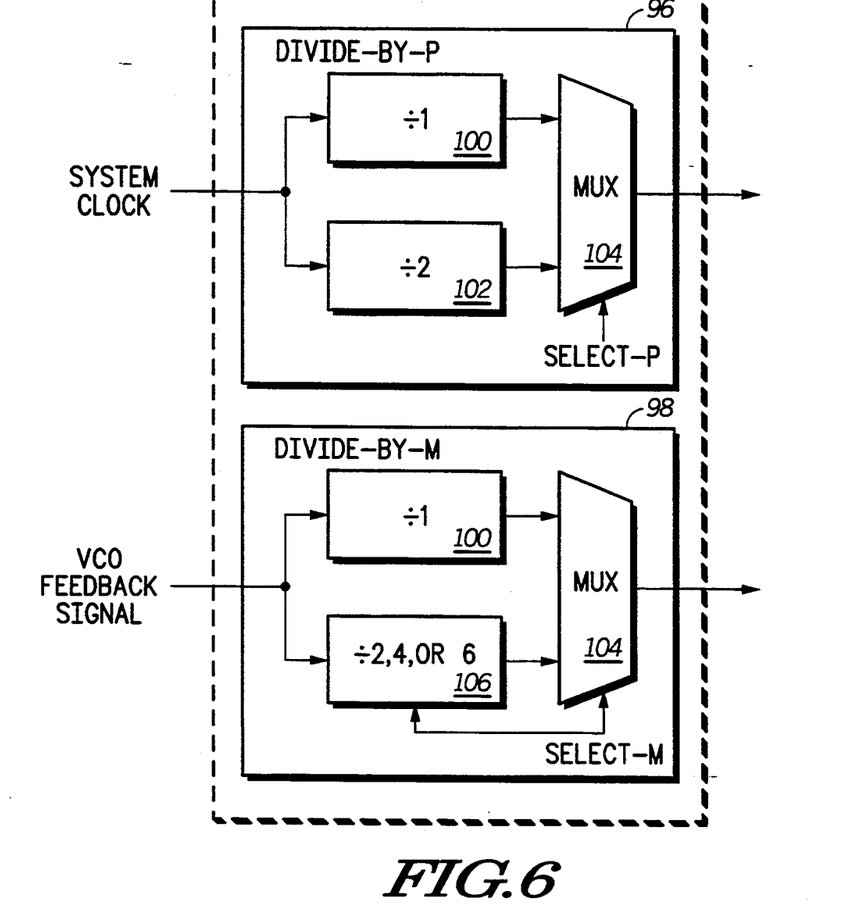
FIG. 6 depicts a block diagram of two divide-by circuits depicted in FIG. 5.

FIG. 6 depicts a block diagram of two divide-by circuits depicted in FIG. 5. In particular, divide-by-P circuit 96 has a delay matching circuit 100, a divide-by-2 circuit 102 and a multiplexer 104. Delay matching circuit 100 is described above and depicted in connection with FIGS. 2 and 4. One exemplary divide-by-2 circuit 102 is also described above in connection with FIG. 2. Multiplexer 104 selects either the output of delay matching circuit 100 or the output of divide-by-two circuit 102 responsive to a control signal, SELECT-P. The particular output selected by multiplexer 104 corresponds to the value of P desired. Divide-by-M circuit 98 also has a delay matching circuit 100, a divide-by-2, 4 circuit 106 and a multiplexer 104. Multiplexer 104 selects either the output of delay matching circuit 100 or the output of divide-by-2, 4 or 6 circuit 106 responsive to a control signal(s), SELECT-M. The control signal SELECT-M also determines by what ratio divide-by-2, 4 or 6 circuit 106 reduces the frequency of the VCO FEEDBACK SIGNAL.

In one embodiment, multiplexers 104 are identical. The two multiplexers may have the same number of inputs even though divide-by-P circuit 96 and divide-by-circuit 98 may have a different number of individual divide-by-N circuits. This refinement will further match the delay propagation time of divide-by-P circuit 96 with divide-by-M circuit 98.

It is well known in the art to construct divide-by-N circuits that reduce the frequency of an input clock signal by N, where N is one or more integers. These circuits are commonly constructed with flip-flops that are clocked synchronously by a clock signal such as SYSTEM CLOCK or VCO OUT. Flip-flops, like all circuits, add a certain mount of propagation delay to a circuit path that incorporates them. This delay must be matched in the case of PLL 88 if a high degree of phase alignment is required. For instance, if PLL 88 is designed to generate an output clock signal that is four times faster than the reference clock signal, then the control signal SELECT-M would configure divide-by-2, 4 or 6 circuit 106 to divide by 4. However, this configuration alone would generate an output clock signal that would not be phase aligned with respect to the reference clock signal. In this example, the reference clock would proceed directly to phase/frequency detector 90. The output clock signal would be delayed by divide-by-2, 4 or 6 circuit 106 and multiplexer 104. The phase of the output clock signal would be ahead of the phase of the reference clock signal. As depicted, the reference clock signal is routed through delay matching circuit 100 and multiplexer 104. This configuration does not change the frequency of the reference clock signal as it enters phase/frequency detector 90. This configuration only changes the phase of the reference clock signal. The disclosed delay matching circuit allows two clock signals to remain phase aligned while the frequency of one of the signals is reduced by a flip-flop based circuit.

One skilled in the art may make further modifications to flip-flop 68 as required by a particular application. According to the disclosed invention, each such application will have a corresponding delay matching circuit. The corresponding delay matching circuit will be similarly modified to reflect the flip-flop modification.

Figure 7:
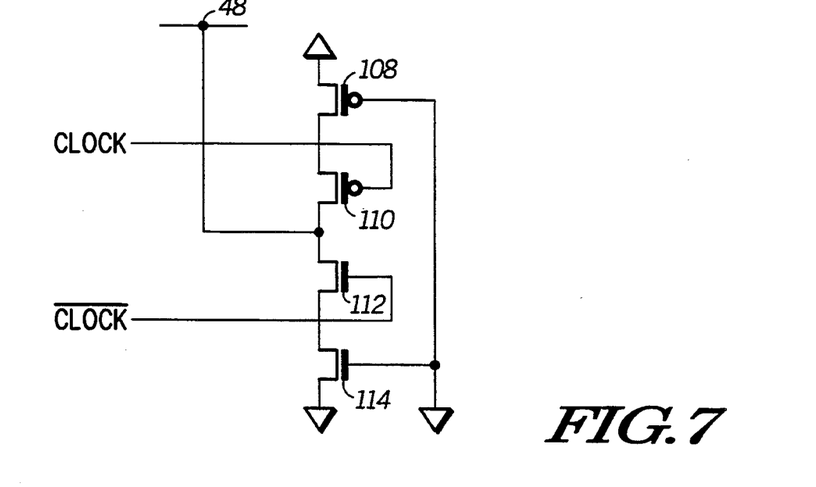
FIG. 7 depicts a portion of an alternate embodiment of the delay matching circuit depicted in FIG. 4.

For instance, FIG. 7 depicts a portion of an alternate embodiment of the delay matching circuit depicted in FIG. 4. This particular delay matching circuit is designed to operate with a modified version of flip-flop 68 (not shown). In the modified flip-flop, pass gate 40 and inverter 42 are combined as were pass gate 36 and inverter 24 in FIG. 3. Therefore, pass gate 58 and inverter 60 in delay matching circuit 78 are similarly combined. In particular, a source of a transistor 108 is connected to the second voltage supply. A gate and a drain of transistor 108 are connected to the first voltage level supply and to a source of a transistor 110, respectively. A gate and a drain of transistor 110 are connected to the control signal CLOCK and to matching input node 48, respectively. The drain of transistor 110 is also connected to a source of a transistor 112. A gate and a drain of transistor 112 are connected to the control signal $\overline{\text{CLOCK}}$ and to a source of a transistor 114. A gate and a source of transistor 114 are connected to the first voltage supply level. As depicted, transistors 108 and 110 are P-channel devices. Transistors 112 and 114 are N-channel devices.

Although the present invention has been described with reference to several specific embodiments, further modifications and improvements will occur to those skilled in the art. For instance, FIG. 6 depicts the general case where it may be desirable to modify both P and M. If P is desired to only have the value 1, then divide-by-2 circuit 102 may be omitted. Similarly, if P is desired to only have the value 1 and the possible range of M may be generated with a single divide-by-M circuit, then divide-by-2 circuit 102 and both multiplexers 104 may be omitted. Also, the terms source, drain and gate may be misconstrued to limit the disclosed invention to one or a few semiconductor media. Therefore, the claims shah recite first current electrode, second current electrode and control electrode to reflect the wide range of media in which the disclosed invention may be practiced. It is to be understood therefore, that the invention encompasses all such modifications that do not depart from the spirit and scope of the invention as defined in the appended claims.

What is claimed is:

1. A delay matching circuit characterized by a first delay which matches a second delay of a separate circuit, the delay matching circuit comprising:

a first node and a second node;

a first loading circuit coupled to the first node and to a second voltage supply terminal, the first loading circuit coupling the second voltage supply terminal to the first node responsive to a first state of a control signal, the first loading circuit characterized by a first predetermined electrical impedance;

a second loading circuit coupled to the first node and to a first voltage supply terminal, the second loading circuit coupling the first voltage supply terminal to the first node responsive to a second state of the control signal, the second loading circuit characterized by a second predetermined electrical impedance;

a buffer circuit electrically coupling the first and second nodes, the buffer circuit characterized by a third predetermined electrical impedance; and a third loading circuit coupled to the second node, the third loading circuit characterized by a fourth predetermined electrical impedance.

2. The delay matching circuit of claim 1 wherein the first and second loading circuits each further comprise:

a first inverter comprising an input and an output; and a switch comprising a first and a second terminal, the first terminal coupled to the output of the inverter.

3. The delay matching circuit of claim 2 wherein the buffer circuit and the third loading circuit further comprise a second inverter and a third inverter, respectively.

4. The delay matching circuit of claim 1 wherein the first loading circuit further comprises:

a first transistor comprising a first current electrode, a second current electrode and a control electrode, the second current electrode coupled to a first voltage supply terminal, the control electrode coupled to the first voltage supply terminal;

a second transistor comprising a first current electrode, a second current electrode and a control electrode, the second current electrode coupled to the first current electrode of the first transistor, the first current electrode coupled to the first node, the control electrode coupled to a logical complement of a control signal;

a third transistor comprising a first current electrode, a second current electrode and a control electrode, the second current electrode coupled to the first node, the control electrode coupled to the control signal; and a fourth transistor comprising a first current electrode, a second current electrode and a control electrode, the second current electrode coupled to the first current electrode of the third transistor, the first current electrode coupled to a second voltage supply terminal, the control electrode coupled to the first voltage supply terminal.

5. The delay matching circuit of claim 4 wherein the second loading circuit further comprises:

an inverter comprising an input and an output; and a switch comprising a first and a second terminal, the first terminal coupled to the output of the inverter.

6. The delay matching circuit of claim 4 wherein the second loading circuit further comprises:
a fifth transistor comprising a first current electrode, a second current electrode and a control electrode, the second current electrode coupled to a first voltage supply terminal, the control electrode coupled to the second voltage supply terminal;
a sixth transistor comprising a first current electrode, a second current electrode and a control electrode, the second current electrode coupled to the first current electrode of the fifth transistor, the first current electrode coupled to the first node, the control electrode coupled to the control signal;
a seventh transistor comprising a first current electrode, a second current electrode and a control electrode, the second current electrode coupled to the first node, the control electrode coupled to the logical complement of the control signal; and
an eighth transistor comprising a first current electrode, a second current electrode and a control electrode, the second current electrode coupled to the first current electrode of the seventh transistor, the first current electrode coupled to a second voltage supply terminal, the control electrode coupled to the second voltage supply terminal.

7. A delay matching circuit for use with a flip-flop, the flip-flop comprising a first and a second portion, the first portion of the flip-flop coupled to the second portion of the flip-flop, the second portion propagating a logic state received from the first portion responsive to a first state of a control signal, the second portion comprising a first and a second node, a coupling circuit and a latch circuit, the first node coupled to the coupling circuit, the coupling circuit characterized by a first impedance, the coupling circuitry coupling the first portion of the flip-flop to the first node responsive to the control signal, the latch circuit storing a logic state in a first mode, the latch circuit comprising a first and a second circuit path between the first and second nodes, the first circuit path characterized by a second impedance in the first mode, the second circuit path characterized by a third impedance, and the second node characterized by a fourth impedance associated with the first circuit path, the delay matching circuit comprising:
a third node and a fourth node;
a first loading circuit coupled to the third node and to a second voltage supply terminal, the first loading circuit coupling the second voltage supply terminal to the third node responsive to a first predetermined state of the control signal, the first loading circuit characterized by the first impedance;
a second loading circuit coupled to the third node and to a first voltage supply terminal, the second loading circuit coupling the first voltage supply terminal to the third node responsive to a second predetermined state of the control signal, the second loading circuit characterized by the second impedance;
a buffer circuit electrically coupling the third and fourth nodes, the buffer circuit characterized by the third impedance; and
a third loading circuit coupled to the fourth node, the third loading circuit characterized by the fourth impedance.

8. The delay matching circuit of claim 7 wherein the first and second loading circuit each further comprise:
a first inverter comprising an input and an output; and
a switch comprising a first and a second terminal, the first terminal coupled to the output of the inverter.

9. The delay matching circuit of claim 8 wherein the buffer circuit and the third loading circuit further comprise a second inverter and a third inverter, respectively.

10. The delay matching circuit of claim 7 wherein the first loading circuit further comprises:
a first transistor comprising a first current electrode, a second current electrode and a control electrode, the second current electrode coupled to a first voltage supply terminal, the control electrode coupled to the first voltage supply terminal;
a second transistor comprising a first current electrode, a second current electrode and a control electrode, the second current electrode coupled to the first current electrode of the first transistor, the first current electrode coupled to the first node, the control electrode coupled to a logical complement of a control signal;
a third transistor comprising a first current electrode, a second current electrode and a control electrode, the second current electrode coupled to the first node, the control electrode coupled to the control signal; and
a fourth transistor comprising a first current electrode, a second current electrode and a control electrode, the second current electrode coupled to the first current electrode of the third transistor, the first current electrode coupled to a second voltage supply terminal, the control electrode coupled to the first voltage supply terminal.

11. The delay matching circuit of claim 10 wherein the second loading circuit further comprises:
an inverter comprising an input and an output; and
a switch comprising a first and a second terminal, the first terminal coupled to the output of the inverter.

12. The delay matching circuit of claim 10 wherein the second loading circuit further comprises:
a fifth transistor comprising a first current electrode, a second current electrode and a control electrode, the second current electrode coupled to a first voltage supply terminal, the control electrode coupled to the second voltage supply terminal;
a sixth transistor comprising a first current electrode, a second current electrode and a control electrode, the second current electrode coupled to the first current electrode of the fifth transistor, the first current electrode coupled to the third node, the control electrode coupled to the control signal;
a seventh transistor comprising a first current electrode, a second current electrode and a control electrode, the second current electrode coupled to the third node, the control electrode coupled to the logical complement of the control signal; and
an eighth transistor comprising a first current electrode, a second current electrode and a control electrode, the second current electrode coupled to the first current electrode of the seventh transistor, the first current electrode coupled to a second voltage supply terminal, the control electrode coupled to the second voltage supply terminal.

13. An apparatus for controlling a propagation delay, the apparatus comprising:
a phase/frequency detector comprising a first and a second input, the first and second input receiving a first and a second clock signal, the first and second clock signal each characterized by a phase and a frequency, the phase/frequency detector generating a first control signal responsive to a phase difference between the first and second clock signals and a frequency difference between the first and second clock signals;

an oscillator circuit coupled to the phase/frequency detector, the oscillator circuit generating an output clock signal characterized by a phase and a frequency, the phase and frequency of the output clock signal responsive to the first control signal;

a frequency reducing circuit comprising an input and an output, the input receiving a selected clock signal and the output generating a reduced frequency clock signal, the selected clock signal and the reduced frequency clock signal each characterized by a frequency, a ratio of the two frequencies corresponding to a predetermined ratio, the input receiving one of either a reference clock signal or to the output clock signal of the oscillator circuit, the output generating one of either the first or second inputs of the phase/frequency detector;

a delay matching circuit receiving the remaining one of either the reference clock signal or the output clock signal of the oscillator circuit and generating the remaining one of either the first or second inputs of the phase/frequency detector, the delay matching circuit comprising:

a first node and a second node;

a first loading circuit coupled to the first node and to a second voltage supply terminal, the first loading circuit coupling the second voltage supply terminal to the first node responsive to a first state of a control signal, the first loading circuit characterized by a first predetermined electrical impedance;

a second loading circuit coupled to the first node and to a first voltage supply terminal, the second loading circuit coupling the first voltage supply terminal to the first node responsive to a second state of the control signal, the second loading circuit characterized by a second predetermined electrical impedance;

a buffer circuit electrically coupling the first and second nodes, the buffer circuit characterized by a third predetermined electrical impedance; and a third loading circuit coupled to the second node, the third loading circuit characterized by a fourth predetermined electrical impedance.

14. The apparatus of claim 13 wherein the first and second loading circuits each further comprise:

a first inverter comprising an input and an output; and a switch comprising a first and a second terminal, the first terminal coupled to the output of the inverter.

15. The apparatus of claim 14 wherein the buffer circuit and the third loading circuit further comprise a second inverter and a third inverter, respectively.

16. The apparatus of claim 13 wherein the first loading circuit further comprises:

a first transistor comprising a first current electrode, a second current electrode and a control electrode, the second current electrode coupled to a first voltage supply terminal, the control electrode coupled to the first voltage supply terminal;

a second transistor comprising a first current electrode, a second current electrode and a control electrode, the second current electrode coupled to the first current electrode of the first transistor, the first current electrode coupled to the first node, the control electrode coupled to a logical complement of a control signal;

a third transistor comprising a first current electrode, a second current electrode and a control electrode, the second current electrode coupled to the first node, the control electrode coupled to the control signal; and a fourth transistor comprising a first current electrode, a second current electrode and a control electrode, the second current electrode coupled to the first current electrode of the third transistor, the first current electrode coupled to a second voltage supply terminal, the control electrode coupled to the first voltage supply terminal.

17. The apparatus of claim 16 wherein the second loading circuit further comprises:

an inverter comprising an input and an output; and a switch comprising a first and a second terminal, the first terminal coupled to the output of the inverter.

18. The apparatus of claim 13 wherein the frequency reducing circuit comprises:

a first portion of a flip-flop for receiving a logic state;

a second portion of a flip-flop coupled to the first portion of the flip-flop, the second portion propagating the logic state received from the first portion responsive to a first state of a second control signal, the second portion comprising:

a first node and a second node;

a coupling circuit coupled to the first node, the coupling circuit characterized by a first impedance, the coupling circuitry coupling the first portion of the flip-flop tot he first node responsive to the second control signal; and a latch circuit storing a logic state in a first mode, the latch circuit comprising a first and a second circuit path between the first and second nodes, the first circuit path characterized by a second impedance in the first mode, the second circuit path characterized by a third impedance, and the second node characterized by a fourth impedance with the first circuit path; and wherein the delay matching circuit comprises:

a third node and a fourth node;

a first loading circuit coupled to the third node and to a second voltage supply terminal, the first loading circuit coupling the second voltage supply terminal to the third node responsive to a first predetermined state of the control signal, the first loading circuit characterized by the first impedance;

a second loading circuit coupled to the third node and to a first voltage supply terminal, the second loading circuit coupling the first voltage supply terminal to the third node responsive to a second predetermined state of the control signal, the second loading circuit characterized by the second impedance;

a buffer circuit electrically coupling the third and fourth nodes, the buffer circuit characterized by the third impedance; and a third loading circuit coupled to the fourth node, the third loading circuit characterized by the fourth impedance.

19. The apparatus of claim 18 wherein the first and second loading circuits each further comprise:

a first inverter comprising an input and an output; and a switch comprising a first and a second terminal, the first terminal coupled to the output of the inverter.

20. The apparatus of claim 19 wherein the buffer circuit and the third loading circuit further comprise a second inverter and a third inverter, respectively.

* * * * *